United States Patent
Rieger et al.

[11] Patent Number: 5,850,595
[45] Date of Patent: Dec. 15, 1998

[54] ARRANGEMENT FOR REDUCING INTERFERENCE IN TUNED CIRCUITS IN INTEGRATED CIRCUITS

[75] Inventors: Martin Rieger, Rottwell; Albrecht Rothermel, Villingen-Schwenningen, both of Germany

[73] Assignee: Deutsche Thomson-Brandt GmbH, Villingen-Schwenningen, Germany

[21] Appl. No.: 348,475

[22] Filed: Dec. 1, 1994

[30] Foreign Application Priority Data

Dec. 3, 1993 [DE] Germany ............ 43 41 221.1

[51] Int. Cl.$^6$ ............................. H04B 1/26
[52] U.S. Cl. ................. 455/317; 455/318; 455/323
[58] Field of Search ................. 455/296, 310, 455/313, 317, 318, 319, 333, 323, 325, 327; 331/57, 135, 177 R, 25; 257/700, 701, 702, 713

[56] References Cited

U.S. PATENT DOCUMENTS

| | | | |
|---|---|---|---|
| 3,611,146 | 10/1971 | Cooper et al. | 325/105 |
| 4,331,940 | 5/1982 | Uwano | 331/99 |
| 5,061,907 | 10/1991 | Rasmussen | 331/57 |
| 5,063,360 | 11/1991 | Sigmon | 331/175 |
| 5,266,963 | 11/1993 | Carter | 455/325 |
| 5,305,186 | 4/1994 | Appelt et al. | 257/713 |
| 5,384,557 | 1/1995 | Yosida | 33/137 |
| 5,428,837 | 6/1995 | Bayruns et al. | 455/317 |

FOREIGN PATENT DOCUMENTS

| | | |
|---|---|---|
| 2015579 | 10/1970 | Germany . |
| 2630992 | 1/1978 | Germany . |
| 3934224 | 1/1991 | Germany . |
| 1287209 | 8/1972 | United Kingdom . |

OTHER PUBLICATIONS

A 50 GHz GaAs FET MIC Transmitter/Receiver Using Hermetic Miniature Probe Transistions, IEEE Transitions, IEEE Transactions No. 9, Sep. 1989.

A Highly–Stable 36 GHz GaAs FET DRO with Phase–Lock Capability—Microwave Journal, Jul. 1989.

On the Design of a Voltage–Tuned Push–Push Dielectric Resonator Oscillator—Microwave Journal Jun. 1990.

MMIC: On–Chip Turnability—Microwave Journal Apr. 1987.

*Primary Examiner*—Thanh Cong Le
*Attorney, Agent, or Firm*—Joseph S. Tripoli; Frederick A. Wein

[57] ABSTRACT

An arrangement for reducing interference in tuned circuits in integrated circuits as a result of the reception and transmission of high frequencies. An external tuned circuit is integrated in the integrated circuit and the interference which is otherwise produced by the connecting pins is eliminated.

5 Claims, 1 Drawing Sheet

ARRANGEMENT FOR REDUCING INTERFERENCE IN TUNED CIRCUITS IN INTEGRATED CIRCUITS

BACKGROUND

The invention is based on an arrangement for reducing interference in tuned circuits in integrated circuits.

It is known for an oscillator which drives a mixer to be used in integrated circuits. Furthermore, an RF signal, which is converted by the mixer into an IF signal, is supplied to the mixer via an external tuned circuit. In the case of such an arrangement, interference occurs as a result of the reception and transmission of high frequencies.

The invention is based on the object of creating a simple arrangement for reducing interference in tuned circuits in integrated circuits.

In the case of the known external circuitry of the oscillator, interference as a result of the reception and transmission of high frequencies occurs via the connecting pins of the integrated circuit and via the external tuned circuit as a result of a tuned circuit which preferably consists of an inductance and a capacitor.

According to the invention, the external tuned circuit is integrated in the integrated circuit. The interference which is otherwise produced as a result of the connecting pins and the circuitry is thus obviated. A major basic idea of this solution is thus linked to the fact that the coupling effect of the external connecting pin and its circuitry is many times greater than the connecting points in the interior of the integrated circuit. Reducing this coupling effect ensures that injection of interference is obviated.

The tuned circuit is formed from an inductance and a capacitance. The inductance is formed by a bonding wire in the integrated circuits. The capacitance is formed by a capacitor. This capacitor is on the one hand completely integrated in the interior of the circuit, in the same way as the other components of the integrated circuit. Nevertheless, however, it is possible to form the capacitor by means of normal components and to bond the said capacitor onto the integrated circuit.

Since the tuned circuit is intended to be designed to be tunable, a capacitance diode can preferably be used as an oscillating element. Since the inductance is formed by bonding wires, these bonding wires are advantageously used to form the connecting conductors to the capacitor.

A further advantage is that, as a result of the absence of the interfering capacitances and inductances of the connecting pins, the control range of the capacitor is improved and the tuning range is increased. The costs are reduced as a result of this construction, the completely integrated construction of the inductance and of the capacitance being the most favourable solution.

The bonding wire is manufactured reproducibly accurately and is fed to the individual connecting points in an arc, over the chip. It is surrounded by an epoxy-resin layer in the same way as the other bonding wires in the integrated circuit, so that it is accurately fixed.

The interconnection of a plurality of oscillators in an integrated circuit is difficult to achieve since the oscillators influence one another via the connecting pins and their circuitry. In this way, it is possible to connect a plurality of oscillators since the oscillator in the integrated circuit is not influenced by the oscillator outside the integrated circuit.

In the case of a development of the invention, a ring oscillator is used as the oscillator in order to supply the appropriate oscillator frequency to the mixer.

At increasingly higher frequencies, the problem arises that the bonding wires exert an increasing influence on the oscillator as a result of the high frequencies. This disadvantage is overcome by the use of the ring oscillator, which can also be integrated in the integrated circuit.

In order to form the spectrum of the ring oscillator appropriately for the application, the ring oscillator can be connected to a PLL circuit. The PLL circuit smoothes out fluctuations and phase noise from the ring oscillator. A PLL circuit having a bandwidth which is as wide as possible must be used since the noise is overcome only within this bandwidth so that the control operates within this bandwidth. The PLL circuit should therefore preferably have a bandwidth of 1 MHz.

It is also possible to reduce the noise by the ring oscillator being designed in circuity term such that a large amount of noise is not produced from the start. The noise would be further reduced if the diodes, or at least one diode stage of the ring oscillator, which are used as the load were replaced by a tuned circuit.

In this case, the combination with the broad band PLL circuit would be advantageous, an improved tuning range and a linear tuning characteristic being provided.

BRIEF DESCRIPTION OF THE DRAWINGS

The invention is explained in the following text with reference to the drawing, in which.

DETAILED DESCRIPTION OF THE PREFERRED EMBODIMENT

Figure 1:
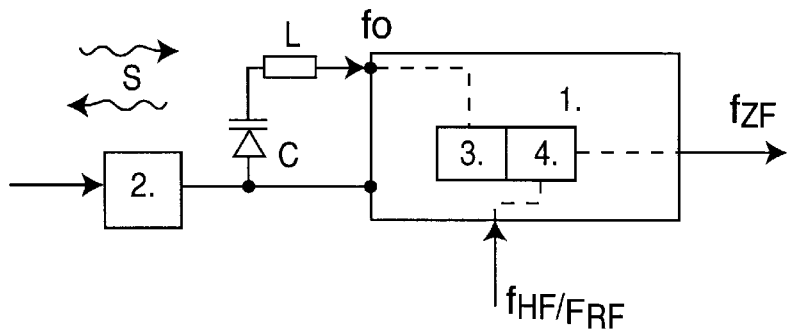
FIG. 1 shows an integrated circuit having upstream oscillating elements.

FIG. 1 shows an integrated circuit with upstream tuning elements. The controller 2 is connected to the capacitance diode C and to the integrated circuit 1. The capacitance diode C is connected via the inductance L to the integrated circuit 1. The oscillator 3 and the mixer 4, which are in contact with one another, are located in the integrated circuit. The capacitance diode C and the inductance L form a tuned circuit. The frequency of the tuned circuit fo is fed to the oscillator. The frequency fo is=½×π√(L×C). The radio frequency fRF=fo±fRF is also fed to the mixer 4. The interference S influences the specified tuned circuit in a negative manner.

Figure 2:
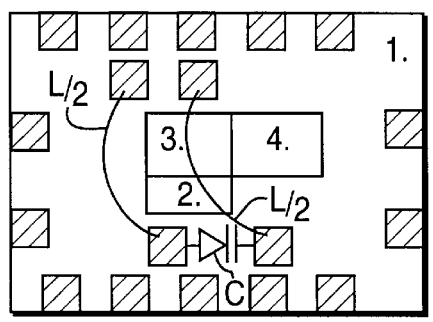
FIG. 2 shows an integrated circuit having integrated oscillating elements.

FIG. 2 shows an integrated circuit having integrated oscillating elements. The controller 2, the oscillator 3, the mixer 4, the capacitance diode C and the inductance L are integrated in the integrated circuit. The inductance L is in each case formed by a bonding wire. The total inductance L results in each case by the addition of the inductance elements of the two bonding wires. The bonding wires are arranged in the shape of an arc. The capacitance diode is in this case bonded onto the integrated circuit. The bonding wires are thus preferably also used as connecting conductors.

Figure 3:
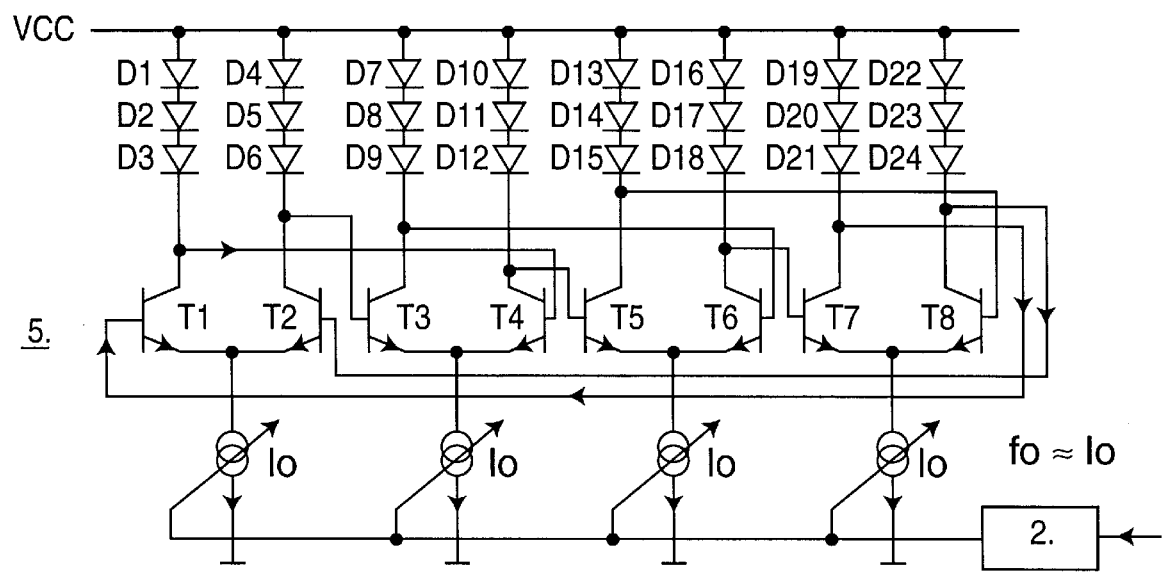
FIG. 3 shows a ring oscillator.

FIG. 3 shows a known ring oscillator. The voltage VCC is fed to the diodes D1, D4, D7, D10, D13, D16, D19, D22. Three diodes D1, D2, D3; D4, D5, D6; D7, D8, D9; D10, D11, D12; D13, D14, D15; D16, D17, D18; D19, D20, D21; D22, D23, D24 are in each case connected in series and are located upstream of the collectors of the transistors T1, T2, T3, T4, T5, T6, T7, T8. The collector of the transistor T1 is connected to the base of the transistor T4. The collector of the transistor T2 is connected to the base of the transistor T3. The collector of the transistor T3 is connected to the base of the transistor T6. The collector of the transistor T4 is connected to the base of the transistor T5. The collector of the transistor T5 is connected to the base of the transistor T8. The collector of the transistor T6 is connected to the base of the transistor T7. The collector of the transistor T7 is connected to the base of the transistor T1. The collector of the transistor T8 is connected to the base of the transistor T2. The emitters of the transistors T1, T2; T3, T4; T5, T6; T7, T8 are connected to one another and are fed to the current source $I_O$. The current source $I_O$ can be controlled by the controller 2. The frequency fo is proportional to the current source $I_O$.

Figure 4:
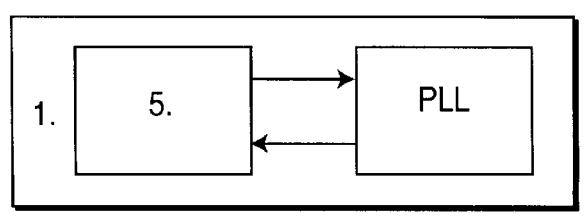
FIG. 4 shows the combination of a ring oscillator with a PLL circuit.

FIG. 4 shows the combination of the ring oscillator 5 with a PLL circuit. This combination is combined in an integrated circuit 1. When a ring oscillator and a PLL circuit are connected together for test purposes, tuning ranges from 30 MHz to 2 GHz are possible using such an arrangement. Furthermore, the tuning is very linear, that is to say the frequency changes linearly as a function of the parameters. Thus, in this case, the current changes linearly as a function of the frequency.

We claim:

1. An arrangement for reducing interference in an integrated circuit comprising:

a mixer, an oscillator coupled to the mixer a capacitance diode, an inductance, and a controller coupled to the capacitance diode via a first bond wire which forms a first part of the inductance, the capacitance diode being coupled to the oscillator via a bond wire which forms a second part of the inductance.

2. The arrangement according to claim 1, wherein the first and second part of the inductance form the total inductance.

3. The arrangement according to claim 1, wherein the first and second part of the inductance form less than the total inductance.

4. The arrangement according to claim 3, wherein the bond wires are arranged in the form arc and are potted in an epoxy-resin layer.

5. The arrangement according to claim 3, wherein the capacitance diode is secured onto the integrated circuit.

* * * * *